United States Patent
Nishizuka

(10) Patent No.: US 7,842,617 B2
(45) Date of Patent: Nov. 30, 2010

(54) ETCHING METHOD AND ETCHING APPARATUS

(75) Inventor: Tetsuya Nishizuka, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 692 days.

(21) Appl. No.: 11/791,718

(22) PCT Filed: Nov. 18, 2005

(86) PCT No.: PCT/JP2005/021256

§ 371 (c)(1),
(2), (4) Date: May 29, 2007

(87) PCT Pub. No.: WO2006/057202

PCT Pub. Date: Jun. 1, 2006

(65) Prior Publication Data

US 2008/0138996 A1 Jun. 12, 2008

(30) Foreign Application Priority Data

Nov. 29, 2004 (JP) ............................. 2004-344608

(51) Int. Cl.
H01L 21/302 (2006.01)
H01L 21/461 (2006.01)
(52) U.S. Cl. .................... 438/710; 438/718; 216/75; 216/79
(58) Field of Classification Search ............... 216/75, 216/79; 438/710, 718
See application file for complete search history.

(56) References Cited

U.S. PATENT DOCUMENTS

| 4,579,623 | A * | 4/1986 | Suzuki et al. ................. 438/7 |
| 5,880,033 | A * | 3/1999 | Tsai ........................... 438/710 |
| 6,723,652 | B1 * | 4/2004 | Fukuda ....................... 438/714 |
| 2001/0008806 | A1 * | 7/2001 | Kitagawa .................... 438/712 |

FOREIGN PATENT DOCUMENTS

| JP | 10-116824 | 5/1998 |
| JP | 11-135481 | 5/1999 |
| JP | 2000-252259 | 9/2000 |
| JP | 2002-355550 | 12/2002 |
| JP | 2004-119781 | 4/2004 |

(Continued)

OTHER PUBLICATIONS

Notification of Transmittal of Copies of Translation of the International Preliminary Report on Patentability (Form PCT/IB/338) in connection with PCT/JP2005/021256, dated Jan. 2004.

(Continued)

*Primary Examiner*—Roberts Culbert
(74) *Attorney, Agent, or Firm*—Smith, Gambrell & Russell, LLP

(57) ABSTRACT

The present invention is an etching method for performing an etching process in the presence of a plasma on an object to be processed in which a layer to be etched made of a tungsten-containing material is formed on a base layer made of a silicon-containing material in a process vessel capable of being evacuated to create therein a vacuum, wherein a chlorine-containing gas, an oxygen-containing gas, and a nitrogen-containing gas are used as an etching gas for performing the etching process.

5 Claims, 7 Drawing Sheets

FOREIGN PATENT DOCUMENTS

| | | |
|---|---|---|
| JP | 2004-273532 | 9/2004 |
| WO | WO 02/80253 | 3/2002 |

OTHER PUBLICATIONS

International Preliminary Report on Patentability (Form PCT/IB/373) in connection with PCT/JP2005/021256, dated Jan. 2004.

Written Opinion of the International Searching Authority (Form PCT/ISA/237) in connection with PCT/JP2005/021256, dated Jan. 2004.

* cited by examiner

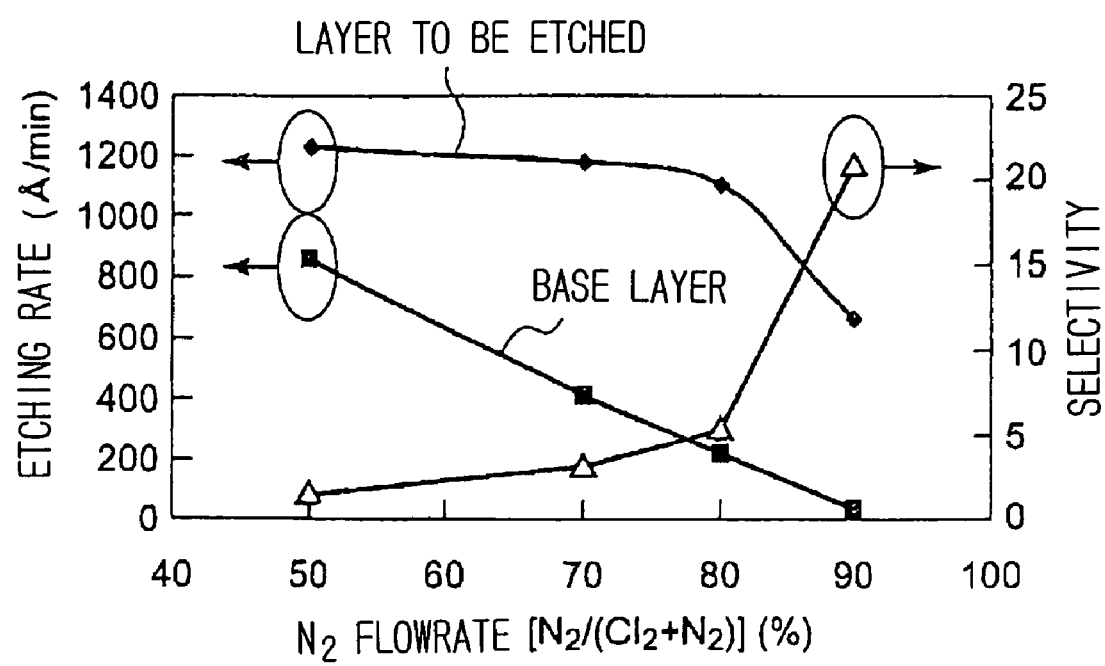
F I G. 4

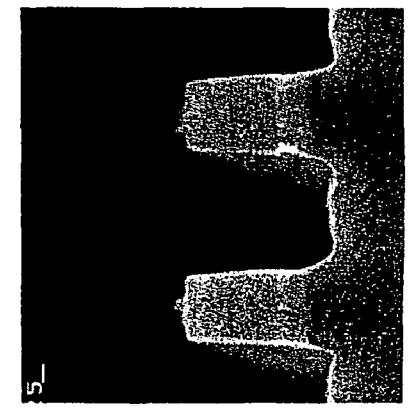
FIG.5A <50%>
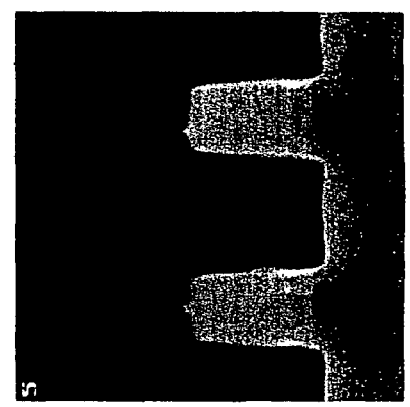
FIG.5B <70%>
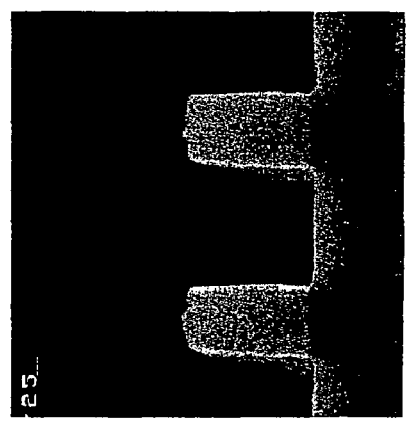
FIG.5C <80%>
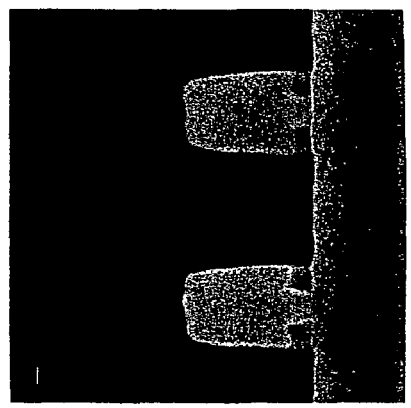
FIG.5D <90%>

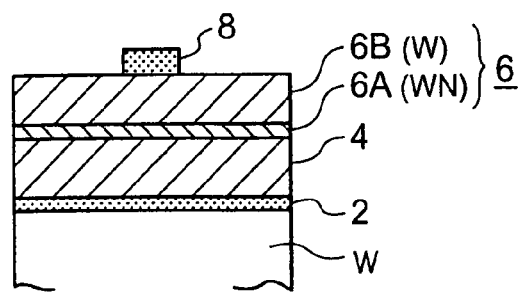
FIG. 8
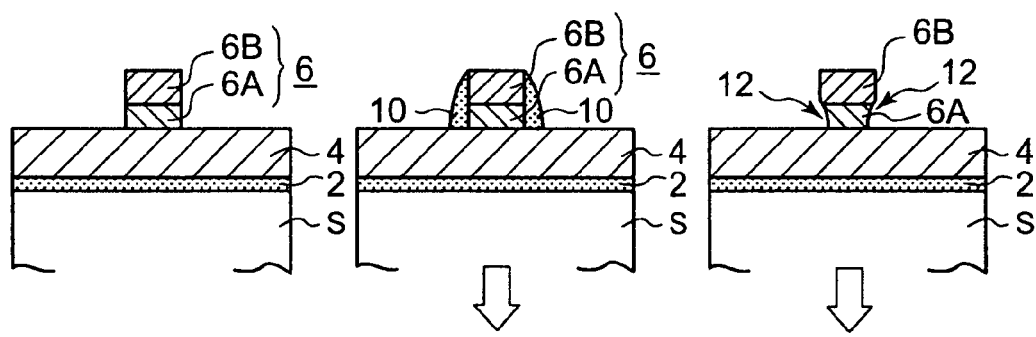
FIG. 9A
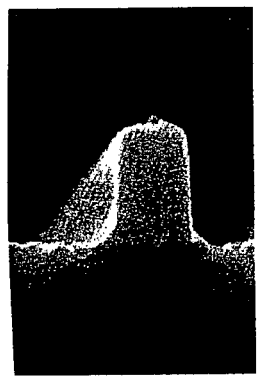 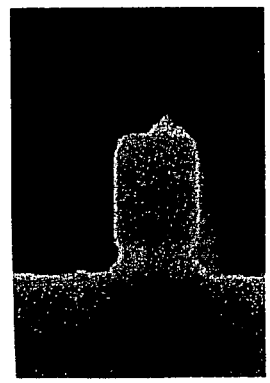
FIG. 9B  FIG. 9C

ETCHING METHOD AND ETCHING APPARATUS

TECHNICAL FIELD

The present invention relates to an etching method and an etching apparatus for conducting an etching process on a surface of an object to be processed, such as a semiconductor wafer, with the use of an etching gas activated by a plasma.

BACKGROUND ART

In a manufacture of an integrated circuit of a semiconductor product, an object to be processed such as a semiconductor wafer is generally subjected to various processes such as a film-deposition process, modification process, oxidation and diffusion process, etching process, and so on. In recent years, a semiconductor circuit has been required to be further miniaturized while having an increased density and a thinner film thickness. Also, an improvement in yield of products is desired. Thus, in the etching process, there is an ongoing need to precisely form an etching shape as specified in the design and simultaneously to maintain a high selectivity of a layer to be etched relative to a base layer.

In the etching process, an etching gas is generally selected considering a selectivity between a layer to be etched and a base layer positioned below the layer to be etched to serve as an etching stopper layer. There has been a tendency to utilize a plasma in the etching process in order that an object to be processed can be etched at a lower temperature and that an etching efficiency can be enhanced (see, JP11-111689A and JP2004-39935A).

Given herein as an example to describe a conventional etching process is a case where a pattern is etched in a tungsten-containing film formed on a polysilicon layer so as to make a gate electrode.

FIG. 8 is an enlarged sectional view of a part of an object to be processed. As shown in FIG. 8, the object to be processed includes a semiconductor wafer W such as a silicon substrate. An $SiO_2$ film 2 to become a gate oxide film, and a base layer 4 formed of a silicon-containing material, e.g., a polysilicon layer, are formed on a surface of the semiconductor wafer W. A layer to be etched 6 made of a tungsten-containing material is formed on the base layer 4. In this example, the layer to be etched 6 has a laminated structure including a tungsten nitride (WN) film 6A as a lower layer and a tungsten (W) film 6B as an upper layer. A patterned mask 8 for forming a gate electrode is formed on an upper surface of the layer to be etched 6. An SiN film, an $SiO_2$ film, or a photoresist film may be used as the mask 8, for example.

The semiconductor wafer W having the above laminated structure has been conventionally etched by using an etching gas such as a $Cl_2$ gas, $NF_3$ gas, and $SF_6$ gas, and using an additive gas such an $O_2$ gas and the like for enhancing the selectivity relative to the base layer. These gases are activated by a plasma for the etching process. An inert gas such as an Ar gas is sometimes supplied according to need. Alternatively, an $N_2$ gas may be used in place of the $O_2$ gas.

The above-described semiconductor wafer W is etched according to the following manner. The etching gas is ionized by a plasma and activated to generate active species, and the active species attack the layer to be etched 6. At this time, the material of the layer to be etched 6, the active species, and the additive gas are reacted with each other to generate a reaction product. The reaction product is vaporized and discharged. As a result, all the parts of the layer to be etched 6 excluding parts protected by the mask 8 are scraped. The etching operation stops at the base layer 4 serving as a stopper layer.

Various substances are generated as reaction products during the etching process. A reaction product such as WF and $WOCl_4$ causes no problem because of a relatively high volatility thereof. However, a reaction product such as $WO_3$ and $WCl_xO_y$ (x and y respectively represent positive numbers), which is produced when a Cl-group gas is used as the etching gas, is disadvantageous in that such reduction product is prone to be deposited because of a relatively low volatility thereof.

As described above, when a flowrate of the $O_2$ gas is increased, the selectivity relative to the base layer 4 can be elevated. However, with the increased flowrate of the $O_2$ gas, the reaction product such as $WO_3$ and $WCl_xO_y$, which is difficult to be evaporated, may adhere to an etched part to degrade an etching shape. On the other hand, when an F-group gas, which is highly reactive, is used as the etching gas, the layer to be etched 6 may be excessively scraped to produce an undercut resulting also in a degraded etching shape.

FIGS. 9A to 9C are pictures taken by an electron microscope and schematic views thereof respectively showing examples of etching shapes formed by the conventional etching process. FIG. 9A is the schematic view showing an appropriate etching shape obtained by the appropriate etching process. FIG. 9B shows an etching shape obtained by using an $N_2$-added $Cl_2$ gas as the etching gas. In this etching process, a nonvolatile deposition 10 such as $WO_3$ and $WCl_xO_y$ was deposited on a periphery of the etching shape. FIG. 9C shows an etching shape obtained by using an $O_2$-added $Cl_2$ gas as the etching gas. In this etching process, a periphery of the etching shape was excessively, arcuately scraped to produce an undercut part 12. That is to say, as shown in FIG. 9B and FIG. 9C, the conventional etching process may invite a degraded etching shape. On the other hand, the use of only the $Cl_2$ gas as the etching gas extremely decrease the selectivity, so that the polysilicon layer as a base layer may be undesirably scraped.

This degradation in etching shape could be negligible heretofore owing to a not so strict dimension design rule regarding a line width, for example. However, with the stricter dimension design rule to achieve a further miniaturization, the degradation in etching shape is now to be solved.

SUMMARY OF THE INVENTION

In view of the above disadvantages, the present invention has been made to efficiently solve the same. The object of the present invention is to provide an etching method and an etching apparatus capable of providing an appropriate etching shape, while maintaining a high selectivity relative to a base layer.

The present inventors have conducted extensive studies on an etching gas and an additive gas used in an etching process, and found the following facts. Namely, in an etching process to etch a thin film formed of a tungsten-containing material such as a tungsten film and a tungsten nitride film, a high selectivity and an appropriate etching shape can be obtained by using: the $Cl_2$ gas, $O_2$ gas, and $N_2$ gas; or the $Cl_2$ gas and an nitric-oxide group gas such as NO. Based on this finding, the inventors have made the present invention.

The present invention is an etching method for performing an etching process in the presence of a plasma on an object to be processed in which a layer to be etched made of a tungsten-containing material is formed on a base layer made of a silicon-containing material in a process vessel capable of being evacuated to create therein a vacuum, wherein a chlorine-containing gas, an oxygen-containing gas, and a nitrogen-containing gas are used as an etching gas for performing the etching process.

According to the present invention, the chlorine-containing gas, the oxygen-containing gas, and the nitrogen containing gas are used as the etching gas for performing the etching process. Thus, an appropriate etching shape can be provided, while maintaining a high selectivity relative to the base layer.

In this case, for example, an added amount of the oxygen-containing gas relative to a total flowrate of the chlorine-containing gas and the nitrogen-containing gas is within a range between 2.9% and 8.6%, and a flowrate of the nitrogen-containing gas relative to the total flowrate of the chlorine-containing gas and the nitrogen-containing gas is within a range between 50% to 80%.

Alternatively, the present invention is an etching method for performing an etching process in the presence of a plasma on an object to be processed in which a layer to be etched made of a tungsten-containing material is formed on a base layer made of a silicon-containing material in a process vessel capable of being evacuated to create therein a vacuum, wherein a chlorine-containing gas and a nitrogen-oxide group gas are used as an etching gas for performing the etching process.

According to the present invention, the chlorine-containing gas and the nitrogen-oxide group gas are used as the etching gas for performing the etching process. Thus, an appropriate etching shape can be provided, while maintaining a high selectivity relative to the base layer.

In this case, for example, the plasma is generated by a microwave.

In addition, for example, the etching process is performed in the process vessel including a planar antenna member of an RLSA (Radial Line Slot Antenna) type.

In addition, for example, the base layer is formed of a polysilicon layer, and the layer to be etched has a laminated structure including a tungsten nitride film and a tungsten film.

In addition, the present invention is a computer-readable storage medium storing a program to control an etching apparatus for performing an etching process in the presence of a plasma on an object to be processed in which a layer to be etched made of a tungsten-containing material is formed on a base layer made of a silicon-containing material in a process vessel capable of being evacuated to create therein a vacuum, such that the etching apparatus performs the etching process by using as an etching gas a chlorine-containing gas, an oxygen-containing gas, and a nitrogen-containing gas.

In addition, the present invention is a computer-readable storage medium storing a program to control an etching apparatus for performing an etching process in the presence of a plasma on an object to be processed in which a layer to be etched made of a tungsten-containing material is formed on a base layer made of a silicon-containing material in a process vessel capable of being evacuated to create therein a vacuum, such that the etching apparatus performs the etching process by using as an etching gas a chlorine-containing gas and a nitrogen-oxide group gas.

In addition, the present invention is an etching apparatus comprising: a process vessel whose inside is capable of being evacuated to create a vacuum; a stage disposed in the process vessel for placing thereon an object to be processed in which a layer to be etched made of a tungsten-containing material is formed on a base layer made of a silicon-containing material; a gas supply unit for supplying into the process vessel a chlorine-containing gas, an oxygen-containing gas, and a nitrogen-containing gas, as an etching gas for performing an etching process; a plasma generating unit for generating a plasma in the process vessel; a control unit for controlling the gas supply unit and the plasma generating unit to execute the steps of supplying the etching gas into the process vessel, and generating a plasma in the process vessel to perform the etching process.

In addition, the present invention is an etching apparatus comprising: a process vessel whose inside is capable of being evacuated to create a vacuum; a stage disposed in the process vessel for placing thereon an object to be processed in which a layer to be etched made of a tungsten-containing material is formed on a base layer made of a silicon-containing material; a gas supply unit for supplying into the process vessel a chlorine-containing gas and a nitrogen-oxide group gas, as an etching gas for performing an etching process; a plasma generating unit for generating a plasma in the process vessel; a control unit for controlling the gas supply unit and the plasma generating unit to execute the steps of supplying the etching gas into the process vessel, and generating a plasma in the process vessel to perform the etching process.

In this case, for example, the plasma is generated by a microwave.

In addition, for example, the plasma generating unit generates a plasma by means of a planar antenna member of an RLSA (Radial Line Slot Antenna) type.

BRIEF DESCRIPTION OF THE DRAWINGS

FIG. 4 is a graph showing an etching dependency of a flowrate of the $N_2$ gas relative to a total flowrate of the $Cl_2$ gas and the $N_2$ gas;

FIGS. 5A to 5D are electron microscope pictures showing etching conditions with a flowrate of the $N_2$ gas being 50%, 70%, 80%, and 90%, respectively;

FIG. 8 is an enlarged sectional view of a part of an object to be processed; and FIGS. 9A to 9C are electron microscope pictures and schematic views showing examples of etching shapes formed by a conventional etching process.

BEST MODE FOR CARRYING OUT THE INVENTION

An Embodiment of the etching apparatus and etching method of the present invention will be described in detail below with reference to the attached drawings.

Figure 1:
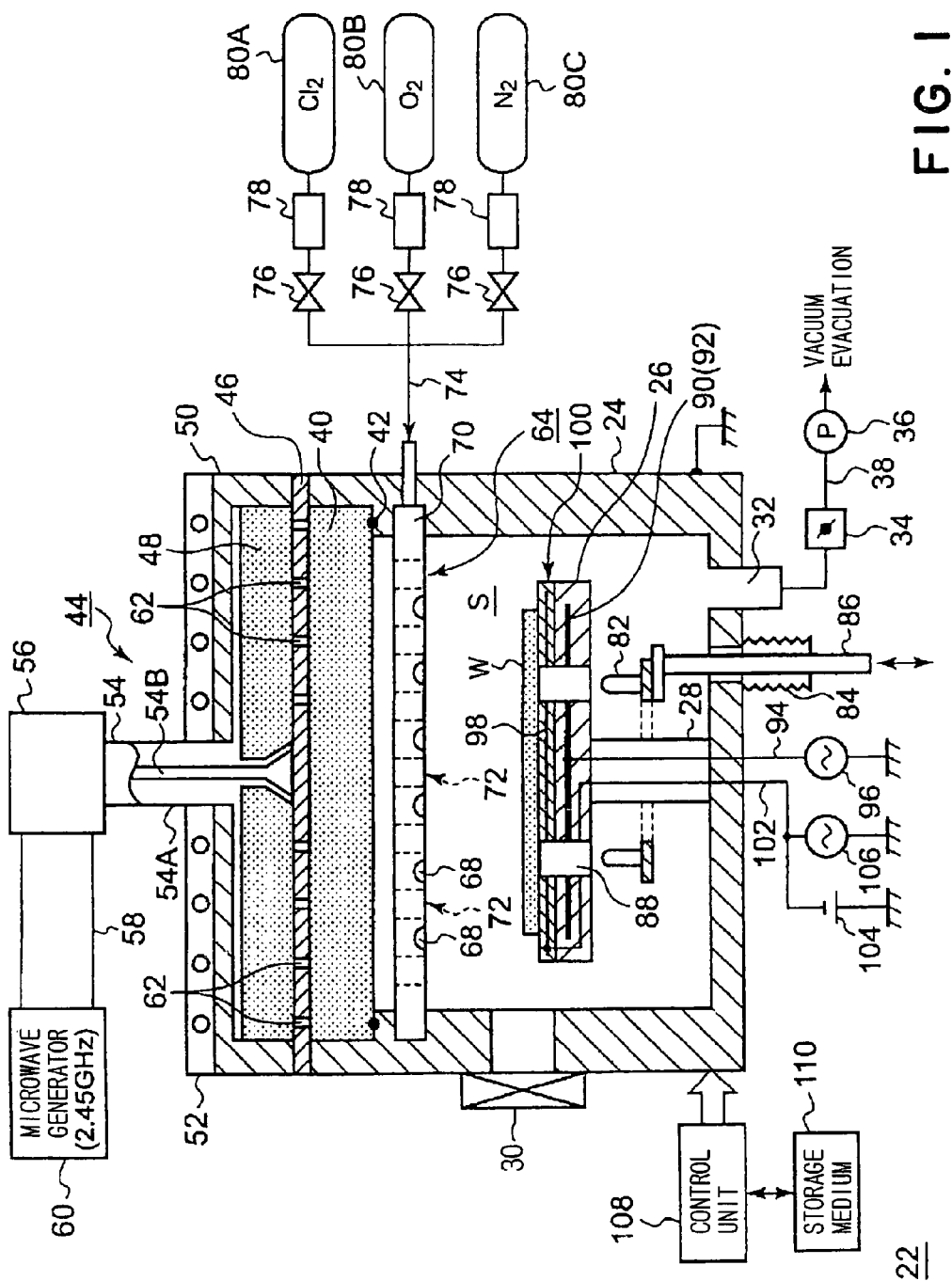
FIG. 1 is a schematic view of an etching apparatus in one embodiment of the present invention.
Figure 2:
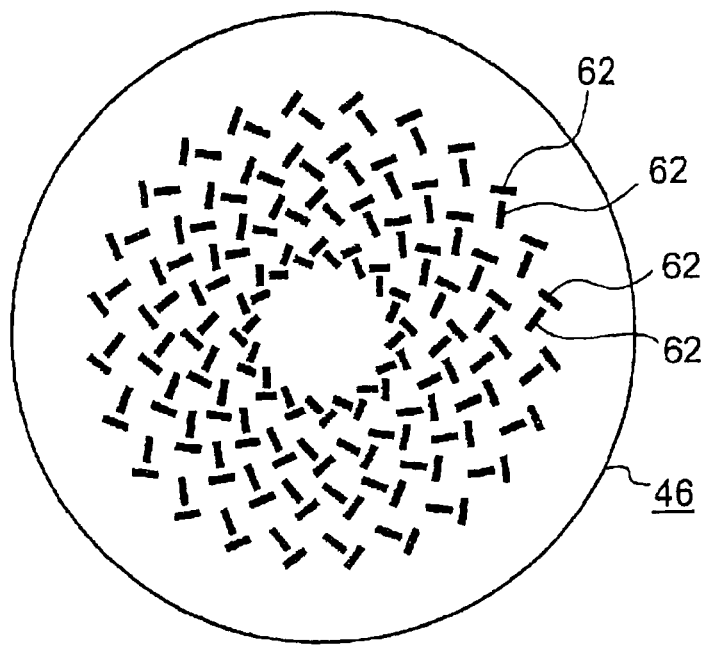
FIG. 2 is a plan view of a planar antenna member of a plasma generating unit.
Figure 3:
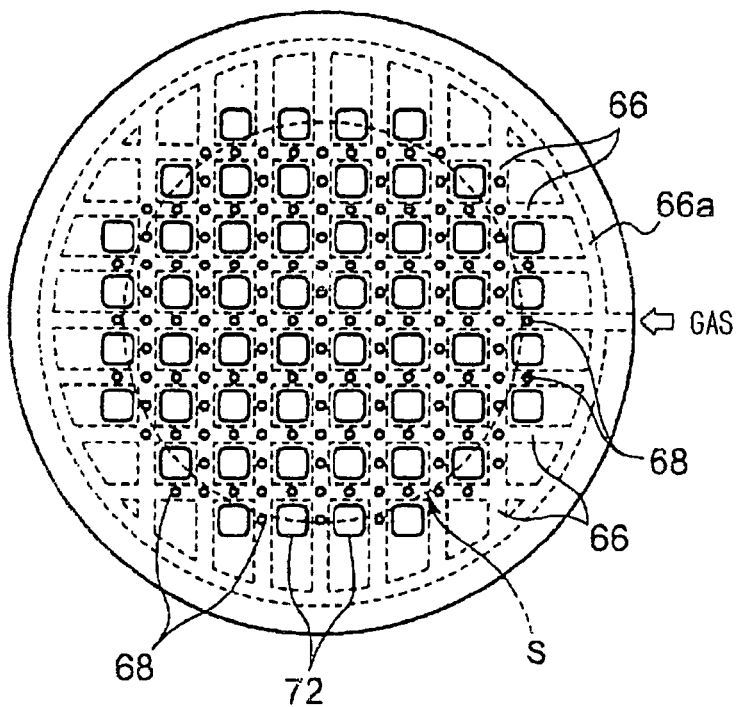
FIG. 3 is a bottom view of a showerhead part of a gas supplying unit.

FIG. 1 is a schematic view of the etching apparatus in one embodiment of the present invention. FIG. 2 is a plan view of a planar antenna member of a plasma generating unit. FIG. 3 is a bottom view of a showerhead part of a gas supplying unit. Herein, an etching apparatus using a planar antenna member of an RLSA type (Radial Line Slot Antenna) is described by way of an example.

As shown in FIG. 1, the etching apparatus 22 in this embodiment includes a process vessel 24 of generally a cylindrical shape. The process vessel 24 has a sidewall and a bottom part, which are formed of a conductive material such as aluminum and are grounded. An inside of the process vessel 24 provides a hermetically sealed process space S in which a plasma is generated.

The process vessel 24 accommodates a stage 26 on which an object to be processed such as a semiconductor wafer W can be placed. The stage 26 is made of anodized aluminum or the like, and has a flat discoid shape The stage 26 is supported by a supporting column 28 made of, e.g., aluminum, which is raised from the bottom part of the process vessel 24.

A gate valve 30 capable of opening and closing is disposed in the sidewall of the process vessel 24. Through the gate valve 30, the wafer W can be loaded into the process vessel 24 and unloaded therefrom. A discharging port 32 is formed in the bottom part of the process vessel 24. A discharging channel 38 is connected to the discharging port 32. A pressure control valve 34 and a vacuum pump 36 are provided on the discharging channel 38. Thus, when needed, the inside of the process vessel 24 can be evacuated up to a predetermined pressure.

A ceiling part of the process vessel 24 is opened (an opening is formed in the ceiling part). A top plate 40 which allows a microwave to pass therethrough is sealingly fitted in the opening via a sealing member 42 such as an O-ring. The top plate 40 is made of a ceramic material such as $Al_2O_3$. In order that the top plate 40 has a pressure resistance, a thickness of the top plate 40 is set at about 20 mm, for example.

A plasma generating unit 44 for generating a plasma in the process vessel 24 is disposed on an upper surface of the top plate 40. To be specific, the plasma generating unit 44 includes a discoid planar antenna member 46 disposed on the upper surface of the top plate 40. A slow-wave member 48 is disposed on the planar antenna member 46. The slow-wave member 48 has a high dielectric constant for shortening a wavelength of a microwave. Substantially all the upper and side surfaces of the slow-wave member 48 is covered with a waveguide box 50 of a conductive hollow cylindrical container. The planar antenna member 46 serves as a bottom plate of the waveguide box 50 and faces the stage 26. Above the waveguide box 50, there is disposed a cooling jacket 52 through which a coolant flows to cool the waveguide box 50.

Peripheral portions of the waveguide box 50 and the planar antenna member 46 are conducted to the process vessel 24. An external tube 54A of a coaxial waveguide 54 is connected to a center of the upper surface of the waveguide box 50. An internal cable 54B inside the coaxial waveguide 54 extends through a hole formed in a center of the slow-wave member 48 to be connected to a center part of the planar antenna member 46.

The coaxial waveguide 54 is connected to a microwave generator 60 having a matching unit (not shown) for generating a microwave of, e.g., 2.45 GHz, via a mode converter 56 and a waveguide 58. Thus, a microwave can be propagated toward the planar antenna member 46. The frequency of the microwave is not limited to 2.45 GHz. Another frequency of, for example, 8.35 GHz is possible. The waveguide 58 herein may be a general waveguide having a circular cross-section or rectangular cross-section or a coaxial waveguide. A function of the slow-wave member 48 having a high dielectric constant, which is disposed in the waveguide box 50 on the upper surface of the planar antenna member 46, is to reduce a guide wavelength of the microwave with the aid of the wavelength reducing effect. For example, aluminum nitride may be used to form the slow-wave member 48.

The planar antenna member 46 suited for a 300 mm wafer is formed of a conductive material having a diameter between 400 mm and 500 mm and a thickness between 1 mm and several mm, for example. More specifically, the planar antenna member 46 may be made of, e.g., a copper plate or aluminum plate with its surface coated with silver. The planar antenna member 46 has a large number of microwave radiating holes 62 each of which is, for example, a through-hole of an elongated groove shape. An arrangement manner of the microwave radiating holes 62 is not particularly limited. For example, the microwave radiating holes 62 may be arranged concentrically, helically, or radially. Alternatively, the microwave radiating holes 64 may be uniformly distributed in the overall surface of the planar antenna member 46. FIG. 2 shows an example of the arrangement of the microwave radiating holes 62, in which a plurality of pairs of microwave radiating holes 64 are concentrically arranged, each pair forming substantially a T-shape although a small gap exists between the two microwave radiating holes 62. The planar antenna member 46 is of a so-called RLSA (Radial Line Slot Antenna) type and thus provides a high plasma density effect and a low electron energy effect.

A gas supply unit 64 for supplying a gas required for an etching process into the process vessel 24 is disposed above the stage 26. In more detail, as shown in FIG. 3, the gas supply unit 64 includes a showerhead part 70 having: gas channels 66 arranged like a grid, a ring-shaped gas channel 66a, and a number of gas jetting holes 68 formed in the gas channels 66. In this case, each end of the grid-like gas channels 66 is connected to the ring-shaped gas channel 66a, whereby an enough amount of the gas can flow through the respective gas channels 66. In addition, the showerhead part 70 is provided with a number of openings 72 at positions excluding the gas channels 66 and 66a. Since the openings 72 are provided vertically through the showerhead part 70, the gas can pass through these openings 72 in up and down directions. In order to maintain a durability of the showerhead part 70 against the etching gas, the showerhead part 70 may be generally formed of quartz or aluminum. Specifically, when a chlorine-group gas is used, the showerhead part 70 is preferably made of quartz.

A gas passage 74 extending outside is connected to the ring-shaped gas channel 66a. The gas passage 74 is divided into branching passages, each of which is provided with an on-off valve 76 and a flowrate controller 78 such as a mass-flow controller, and is connected to each gas source. Here, a chlorine-containing gas, an oxygen-containing gas, and a nitrogen-containing gas are used as the etching gas. More specifically, there are used a $Cl_2$ gas source 80A storing the $Cl_2$ gas as the chlorine-containing gas, an $O_2$ gas source 80B storing the $O_2$ gas as the oxygen-containing gas, and an $N_2$ gas source 80C storing the $N_2$ gas as the nitrogen-containing gas. An alternative structure may be adopted in which two showerhead parts 70 having the above-described structure are arranged in the up and down direction, and the $O_2$ gas and the $N_2$ gas are fed from one showerhead part 70, while the $Cl_2$ gas is fed through the other showerhead part 70.

A plurality of, e.g., three elevating pins 82 (two elevating pins 82 are shown in FIG. 1) which vertically move the wafer W for loading and unloading the wafer W are disposed below the stage 26. The elevating pins 82 are moved up and down by an elevating rod 86 via an elongatable bellows 84, the elevating rod 86 penetrating the bottom part of the process vessel 24. The stage 26 has pin through-holes 88 through which the elevation pins 82 can pass.

The stage 26 is generally made of a heat-resistant material, i.e., ceramics such as alumina. A heating unit 90 is included in the heat-resistant material. The heating unit 90 in this embodiment has a built-in sheet-like electrical resistance heater 92 buried in and substantially all over the stage 26. The electrical resistance heater 92 is connected to a heater power source 96 via a wire 94 extending through the supporting column 28.

A thin electrostatic chuck 100 including a mesh of conductive lines 98 is disposed on an upper surface of the stage 26. In order to exert an electrostatic absorbing force, the conductive lines 98 in the electrostatic chuck 100 are connected to a DC power source 104 through a wire 102. Thus, the wafer W placed on the stage 26, in more detail, on the electrostatic chuck 100, can be absorbed by the electrostatic absorbing force. Also connected to the wire 102 is a biasing radio-frequency power source 106 for applying a biasing radio-frequency power of 13.56 MHz to the conductive lines 98 in the electrostatic chuck 100.

Operations of the etching apparatus 22 are controlled by a control unit 108 formed of a microcomputer or the like. A program executed by the computer is stored in a storage medium 110 such as a flexible disk, a CD (Compact Disc), and a flush memory. Specifically, the control unit 108 issues commands to control supply and flowrates of the respective gases, supply and power of the microwave and the radio-frequency wave, a process temperature, a process pressure, and so on.

Next, an etching method performed by the etching apparatus 22 as structured above will be described.

At first, a semiconductor wafer W is loaded into the process vessel 24 by a carrying arm (not shown) via the gate valve 30. By moving the elevating pins 82 in the up and down direction, the wafer W is placed on the upper surface of the stage 26. The semiconductor wafer W is electrostatically absorbed by the electrostatic chuck 100. As shown in FIG. 8, in the wafer W, a layer to be etched 6 is formed on a base layer 4. A patterned mask 8 has been previously formed on the layer to be etched 6 in a pre-step.

The wafer W is heated by the heating unit 90 and is then maintained at a predetermined process temperature. Meanwhile, the $Cl_2$ gas, the $O_2$ gas, and the $N_2$ gas are supplied at respective predetermined flowrates from the respective gas sources 80A to 80C into the process vessel 24 via the showerhead part 70. The pressure control valve 34 is controlled such that the inside of the process vessel 24 is maintained at a predetermined process pressure. At the same time, the microwave generator 60 of the plasma generating unit 44 is driven to thereby supply a microwave generated by the microwave generator 60 to the planar antenna member 46 through the waveguide 58 and the coaxial waveguide 54. Since a wavelength of the microwave is reduced by the slow-wave member 48, the microwave having a reduced wavelength is introduced from the planar antenna member 46 to the process space. Therefore, a plasma is generated in the process space, and a predetermined etching process using the plasma can be performed.

In more detail, when the microwave is introduced from the planar antenna member 46 to the process vessel 24, the $Cl_2$ gas, the $O_2$ gas, and the $N_2$ gas are made plasma and activated by the microwave, to generate active species. Due to the thus generated active species, the layer to be etched 6 made of a tungsten-containing material formed on the surface of the wafer W is etched and removed, excluding parts protected by the mask 8. The respective gases flow downward, while being diffused substantially uniformly toward the peripheral portion of the stage 26, and are discharged from the discharging channel 38 via the discharging port 32. During the etching process, a biasing radio-frequency is applied from the biasing radio-frequency power 106 to the conductive lines 98 in the electrostatic chuck 100. This aids the active species in entering the surface of the wafer W straightforward, which lowers a possibility that an etching shape is impaired.

In this embodiment, the $Cl_2$ gas as the chlorine-containing gas is used as the etching gas, and the $O_2$ gas as the oxygen-containing gas and the $N_2$ gas as the nitrogen-containing gas are used as the additive gas. Thus, the layer to be etched 6 of a laminated structure including the tungsten nitride film 6A and the tungsten film 6B can be etched with a sufficient selectivity relative to the base layer 4 of a polysilicon layer. Simultaneously, the etching shape does not lose its shape to keep the appropriate etching shape. In other words, this embodiment can provide the appropriate etching shape as shown in FIG. 9A, with preventing occurrence of the conventional degraded etching shape such as adhesion of the non-volatile deposition 10, which is shown in FIG. 9B, and production of the undercut part 12, which is shown in FIG. 9C. In addition to the above-described gases, an inert gas such as an Ar gas and a He gas may be added.

The reason why the appropriate etching process is achieved in this embodiment is considered as follows. That is to say, the $Cl_2$ gas is used as the etching gas, a suitable amount of the $O_2$ gas as the oxygen-containing gas is added to obtain a desired selectivity relative to the base layer 4 of a polysilicon layer, and a suitable amount of the $N_2$ gas as the nitrogen-containing gas is added to appropriately maintain the etching shape. Thus, substances of a high volatility such as WO and $WO_2$ are mainly generated as a reaction product, while virtually no substance of a low volatility is generated. This is the optimum etching condition. Even when a substance of a low volatility is temporarily generated as a reaction product, the substance is considered to be reduced by the active species of the $N_2$ gas and be converted to another substance of a high volatility.

Regarding the process conditions in this embodiment, the process temperature is within a range between, e.g., 60° C. and 80° C., and the process pressure is within a range between e.g., 0.5 Pa and 2 Pa.

Although depending on a size of the process vessel 2, a flowrate of the chlorine-containing gas ($Cl_2$ gas) is within a range between about 100 sccm and 1000 sccm for a 300 mm wafer, for example.

A flowrate of the nitrogen-containing gas relative to a total flowrate of the chlorine-containing gas ($Cl_2$ gas) and the nitrogen-containing gas ($N_2$ gas) is within a range between 50% and 80%. When the flowrate of the $N_2$ gas is less than 50%, a sufficient selectivity cannot be ensured between the layer to be etched 6 and the base layer 4, resulting in the inappropriate etching shape. When the flowrate of the $N_2$ gas is more than 80%, the etching rate is extremely lowered, and a sidewall of the layer to be etched 6 is scraped to generate a side etching.

An added amount of the oxygen-containing gas ($O_2$ gas) relative to the total flowrate of the chlorine-containing gas ($Cl_2$ gas) and the nitrogen-containing gas ($N_2$ gas) is within a range between 2.9% and 8.6%. When the flowrate of the $O_2$ gas is less than 2.9%, the etching rate is considerably lowered, which causes an insufficient throughput. When the flowrate of the $O_2$ gas is more than 8.6%, the etching shape is deteriorated by a deposition on the sidewall.

An evaluation test was conducted for evaluating etching shapes and selectivities relative to the base layer, by varying flowrates of the respective gases. The evaluation result is described below.

FIG. 4 is a graph showing an etching dependency of a flowrate of the $N_2$ gas relative to a total flowrate of the $Cl_2$ gas and the $N_2$ gas. The left-side vertical axis expresses an etching rate (layer to be etched and base layer), and the right-side vertical axis expresses a selectivity. FIGS. 5A to 5D are electron microscope pictures showing etching shape with a flowrate of the $N_2$ gas being 50%, 70%, 80%, and 90%, respectively. The etching process was performed under such conditions that a ratio between the $Cl_2$ gas and the $N_2$ gas was varied, while the total flowrate of the gases was unchanged to keep 700 sccm. A flowrate of the $O_2$ gas was constantly set at 30 sccm.

FIGS. 5A to 5C respectively show relatively appropriate etching shapes. However, in FIG. 5D, a side etching is found. As apparent from the graph in FIG. 4, when a flowrate of the $N_2$ gas is increased, an etching rate of the layer to be etched is not so lowered, while an etching rate of the base layer is remarkably lowered. This case is preferable in view of the improved selectivity. However, when a flowrate of the $N_2$ gas exceeds 80%, an etching rate of the layer to be etched is excessively lowered. In addition, although not shown in FIG. 4, the layer to be etched had a side etching as shown in FIG. 5D. This case is not preferable. On the other hand, a flowrate of the $N_2$ gas being under 50% is not preferable because of a excessively low selectivity. Based on the foregoing result, it was confirmed that a flowrate of the $N_2$ gas should be within a range between 50% and 80%, preferably between 70% and 80% because a practically sufficient selectivity value, i.e., not less than 3.0 can be obtained within this range.

Figure 6:
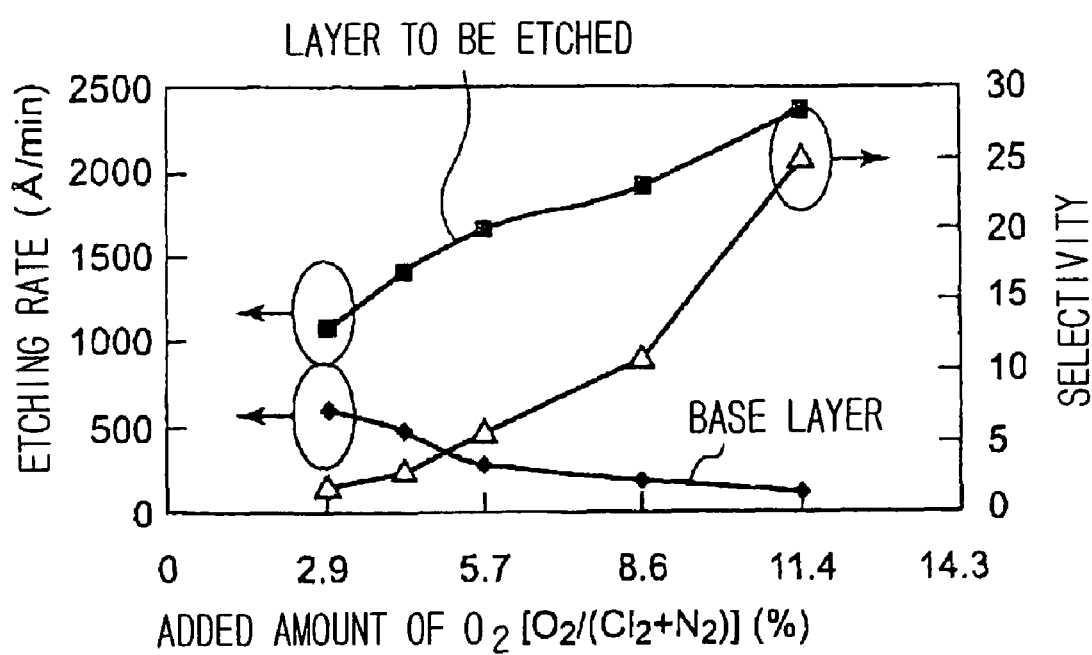
FIG. 6 is a graph showing a relationship between an added amount of the $O_2$ gas relative to a total flowrate of the $Cl_2$ gas and the $N_2$ gas, and a selectivity relative to a base layer.
Figure 7:
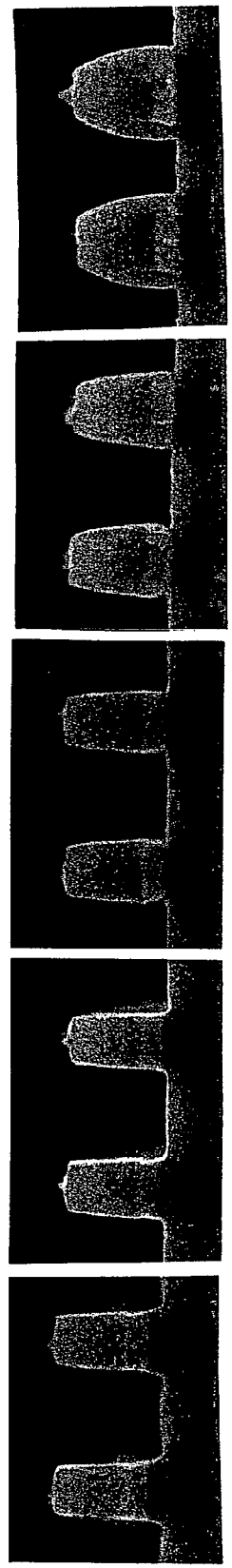
FIGS. 7A to 7E are electron microscope pictures showing etching conditions with an added amount of the $O_2$ gas being 2.9%, 4.3%, 5.7%, 8.6%, and 11.4%, respectively.

FIG. 6 is a graph showing a relationship between an added amount of the $O_2$ gas relative to a total flowrate of the $Cl_2$ gas and the $N_2$ gas, and a selectivity relative to the base layer. The left-side vertical axis expresses an etching rate (layer to be etched and base layer), and the right-side vertical axis expresses a selectivity. FIGS. 7A to 7E are electron microscope pictures showing etching shape with an added amount of the $O_2$ gas being 2.9%, 4.3%, 5.7%, 8.6%, and 11.4%, respectively. The etching process was performed under such conditions that flowrates of the $Cl_2$ gas and the $N_2$ gas were fixed at 200 sccm and 500 sccm, respectively, and that a flowrate of the $O_2$ gas was varied.

FIGS. 7A to 7D respectively show relatively appropriate etching shapes. However, in FIG. 7E, a deposition on the sidewall is found. On the other hand, as apparent from the graph in FIG. 6, as an added amount of the $O_2$ gas was increased, an etching rate of the layer to be etched is raised, but an etching rate of the base layer is reduced, whereby a selectivity was increased. An added amount of the $O_2$ gas which is less than 2.9% is not preferable since an etching rate is excessively lowered. On the other hand, as shown in FIG. 7E, an added amount of the $O_2$ gas which is more than 8.6% is not preferable since a deposition is generated on the sidewall to degrade the etching shape. Based on the foregoing result, it was confirmed that when an added amount of the $O_2$ gas is within a range between 2.9% and 8.6%, an appropriate selectivity can be obtained. In particular, an added amount of the $O_2$ gas is preferably within a range between 4.3% and 5.7%, since a selectivity of not less than 3.0 can be obtained and no sidewall deposition occurs.

In the above embodiment, although the $Cl_2$ gas is used as the chlorine-containing gas, the present invention is not limited thereto. For example, $BCl_3$ may be used. In addition, in place of the oxygen-containing gas and the nitrogen-containing gas used as the additive gas, a nitrogen oxide gas may be used. For example, an NO gas, $N_2O$ gas, $NO_2$ gas and so on may be used as the nitrogen oxide gas.

Further, in this embodiment, the semiconductor wafer W as an object to be processed has such a cross-section structure that a polysilicon layer is formed as the base layer 4. However, the present invention is not limited thereto, and may be applied to the base layer 4 formed of a silicon monocrystal. Furthermore, not limited to the laminated structure including the tungsten nitride film 6A and the tungsten film 6B, the layer to be etched 6 may have any film as long as the film is made of a tungsten-containing material. For example, the present invention may be applied to a monolayer of only a tungsten nitride film or a monolayer of only a tungsten film.

In addition, not limited to a semiconductor wafer, the present invention may be applied to a glass substrate, an LCD substrate, and so on.

The invention claimed is:

1. An etching method for performing an etching process in the presence of a plasma on an object to be processed in which a layer to be etched made of a tungsten, tungsten nitride, or a combination of tungsten and tungsten nitride is on a base layer made of a silicon-containing material in a process vessel capable of being evacuated to create therein a vacuum, wherein
a chlorine gas, an oxygen gas and a nitrogen gas are used exclusively as an etching gas for performing the etching process,
an added amount of the oxygen gas relative to a total flowrate of the chlorine gas and the nitrogen gas is within a range between 2.9% and 8.6%, and
a flowrate of the nitrogen gas relative to the total flowrate of the chlorine gas and the nitrogen gas is within a range between 50% to 80%.

2. The etching method according to claim 1, wherein the plasma is generated by a microwave.

3. The etching method according to claim 1, wherein the etching process is performed in the process vessel including a planar antenna member of an RLSA (Radial Line Slot Antenna) type.

4. The etching method according to claim 1, wherein the base layer is formed of a polysilicon layer, and
the layer to be etched has a laminated structure of a tungsten nitride film and a tungsten film.

5. The etching method according to claim 1, wherein
the added amount of the oxygen gas relative to the total flowrate of the chlorine gas and the nitrogen gas is within a range between 4.3% and 5.7%, and
the flowrate of the nitrogen gas relative to the total flowrate of the chlorine gas and the nitrogen gas is within a range between 70% to 80%.

* * * * *